(12) United States Patent
Melanson

(10) Patent No.: US 6,639,531 B1
(45) Date of Patent: Oct. 28, 2003

(54) CASCADED NOISE SHAPING CIRCUITS WITH LOW OUT-OF-BAND NOISE AND METHODS AND SYSTEMS USING THE SAME

(75) Inventor: John Laurence Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 10/256,499

(22) Filed: Sep. 27, 2002

(51) Int. Cl.$^7$ ................................................ H03M 3/00
(52) U.S. Cl. ..................................................... 341/143
(58) Field of Search .................. 341/143, 118, 341/120, 144, 155

(56) References Cited

U.S. PATENT DOCUMENTS 6,160,506 A * 12/2000 Pellon ........................ 341/143
6,449,569 B1 * 9/2002 Melanson ................... 341/143

* cited by examiner

*Primary Examiner*—Brian Young
(74) *Attorney, Agent, or Firm*—James J. Murphy, Esq.; Winstead Sechrest & Minick PC

(57) ABSTRACT

A delta-sigma data converter includes a first quantizer responsive to outputs of first and second loop filters, the first quantizer introducing a quantization error during quantization. The first loop filter is responsive to an output of the first quantizer. A second quantizer quantizes an error data stream representing the quantization error introduced by the first quantizer. The second loop filter includes an integrator for integrating a quantized error data stream output from the second quantizer. An analog output path responsive to the output of the first quantizer and an output of the integrator generates the converter output.

21 Claims, 3 Drawing Sheets

CASCADED NOISE SHAPING CIRCUITS WITH LOW OUT-OF-BAND NOISE AND METHODS AND SYSTEMS USING THE SAME

FIELD OF INVENTION

The present invention relates in general to delta-sigma modulators and in particular, to cascaded noise shaping circuits with low out-of-band noise and methods and systems using the same.

BACKGROUND OF INVENTION

Delta-sigma modulators are particularly useful in digital to analog and analog to digital converters (DACs and ADCs). Using oversampling, a delta-sigma modulator spreads the quantization noise power across the oversampling frequency band, which is typically much greater than the input signal bandwidth. Additionally, the delta-sigma modulator performs noise shaping by acting as a highpass filter to the noise; most of the quantization noise power is thereby shifted out of the signal band.

The typical delta-sigma modulator in an ADC includes an input summer which sums the analog input signal with negative feedback, an analog linear (loop) filter, a quantizer and a feedback loop with a digital to analog converter (feedback DAC) coupling the quantizer output and the inverting input of the input summer. A delta-sigma DAC is similar, with a digital input summer, a digital linear filter, a digital feedback loop, a quantizer and an output DAC at the modulator output. In a first order modulator, the linear filter comprises a single integrator stage; the filter in higher order modulators normally includes a cascade of a corresponding number of integrator stages. Higher-order modulators have improved quantization noise transfer characteristics over modulators of lower order, but stability becomes a more critical design factor as the order increases. For a given topology, the quantizer can be either a one-bit or a multiple-bit quantizer.

In cascaded delta-sigma modulator topologies, commonly referred to as MASH (multi-stage noise shaping) modulators, multiple delta-sigma noise shaping loops are cascaded to produce high noise attenuation in the signal band of the modulator noise transfer function (NTF) while maintaining modulator stability. In particular, the typical MASH modulator includes two or more cascaded noise shaping loops, each having a loop filter of a given number of filter stages and a quantizer. The quantized output of one noise shaping loop drives the input of the next noise shaping loop in the cascade such that, except for the first noise shaping loop, the input of each noise shaping loop is the quantization error from the previous noise shaping loop in the cascade. The output of each noise-shaping loop is also passed through error cancellation circuitry that cancels the quantization error from all but the last noise-shaping loop in the cascade. The noise shaping of the quantization error output from the last stage of the cascade is therefore approximately nth-order, where n is the total number of loop filter stages in the cascaded noise shaping loops.

Current state of the art conventional MASH modulator topologies are capable of providing signal band noise attenuation in the NTF on the order of −150 dB. Additionally, MASH modulators are less susceptible to DAC non-linearity in data converter applications and are generally more stable than single-loop modulators, especially when based on low-order, proven-stable individual noise shaping loops.

However, conventional MASH modulator topologies also have significant drawbacks. For example, conventional MASH modulator topologies typically achieve high signal band noise attenuation at the expense of increased out-of-band noise gain. More recently, however, out-of-band noise has become a more troublesome problem that must be addressed, especially in such applications as high performance data converters. Consequently, substantial efforts typically must be made. For example, attenuating out-of-band modulator noise at the system level often requires more precise filtering and complicated clocking schemes, which add expense and complexity to the system.

In sum, new noise shaping methods and topologies are required which not only provide the high signal band attenuation typical of MASH converters, but which also significantly attenuate out-of-band noise at the same time.

SUMMARY OF INVENTION

According to the inventive concepts, cascaded delta-sigma modulation circuits and methods are disclosed which provide substantial out-of-band attenuation. According to one particular embodiment, a delta-sigma data converter is disclosed which includes a first quantizer responsive to outputs of first and second loop filters, the first quantizer introducing a quantization error during quantization. The first loop filter is responsive to an output of the first quantizer. A second quantizer quantizes an error data stream representing the quantization error introduced by the first quantizer. The second loop filter includes an integrator for integrating a quantized error data stream output from the second quantizer. An analog output path responsive to the output of the first quantizer and an output of the integrator generates the converter output.

In an exemplary delta-sigma modulator application of the inventive application, a first quantizer is driven by the outputs of both first and second loop filters. The first loop filter filters the converter input signal and feedback from the first quantizer. The second loop filter receives the quantization error introduced by the first quantizer after quantization by a second quantizer This topology advantageously drives down out-of-band noise. In contrast, the, quantization noise from each noise shaping loop of a conventional MASH topology is only fed-forward to the input of the next noise shaping loop in the cascade and the corresponding cancellation logic.

Delta-sigma modulators embodying the inventive principles are suitable for use in data converters in which the output of the first quantizer drives a first digital to analog conversion path and an integrated quantized quantization error tapped from the second loop filter drives a second digital to analog conversion path. The output of the second loop filter is differentiated to generate a noise transfer function (NTF) zero at DC (i.e., at zero frequency) hereby driving-down low frequency components of the resulting analog-converted quantization error and then summed with the output of the first conversion path to generate an analog output signal with low out-of-band noise.

BRIEF DESCRIPTION OF DRAWINGS

For a more complete understanding of the present invention, and the advantages thereof, reference is now made to the following descriptions taken in conjunction with the accompanying drawings, in which.

DETAILED DESCRIPTION OF THE INVENTION

Figure 1:
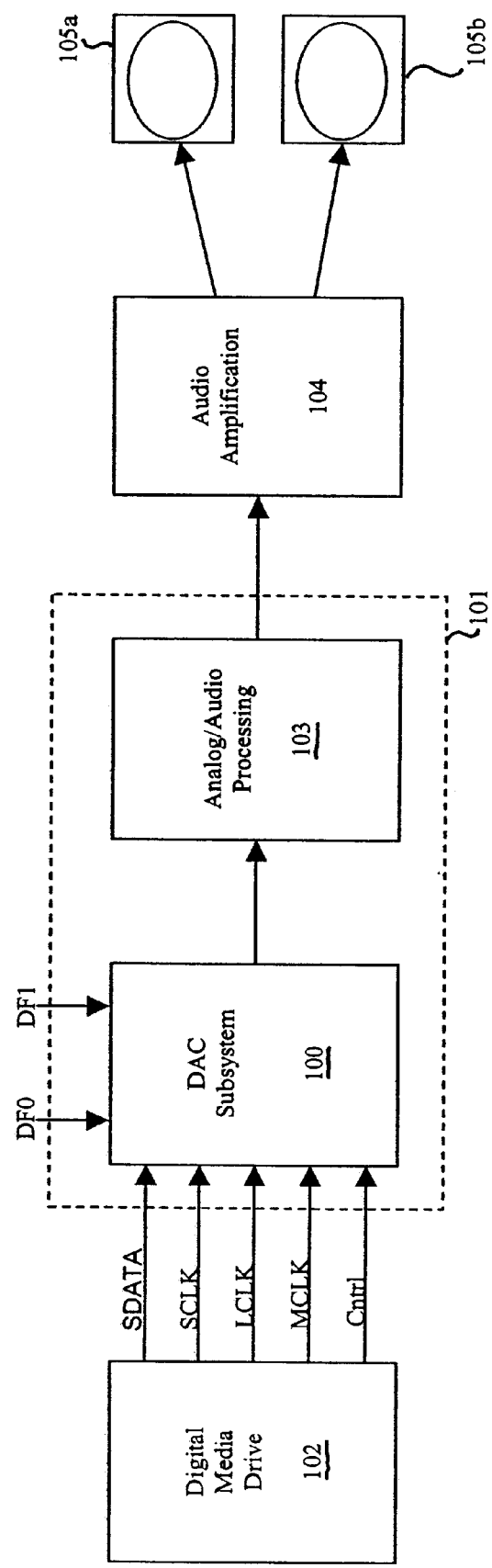
FIG. 1 is a diagram of a representative system application of a digital to analog converter (DAC) according to the principles of the present invention.
Figure 2:
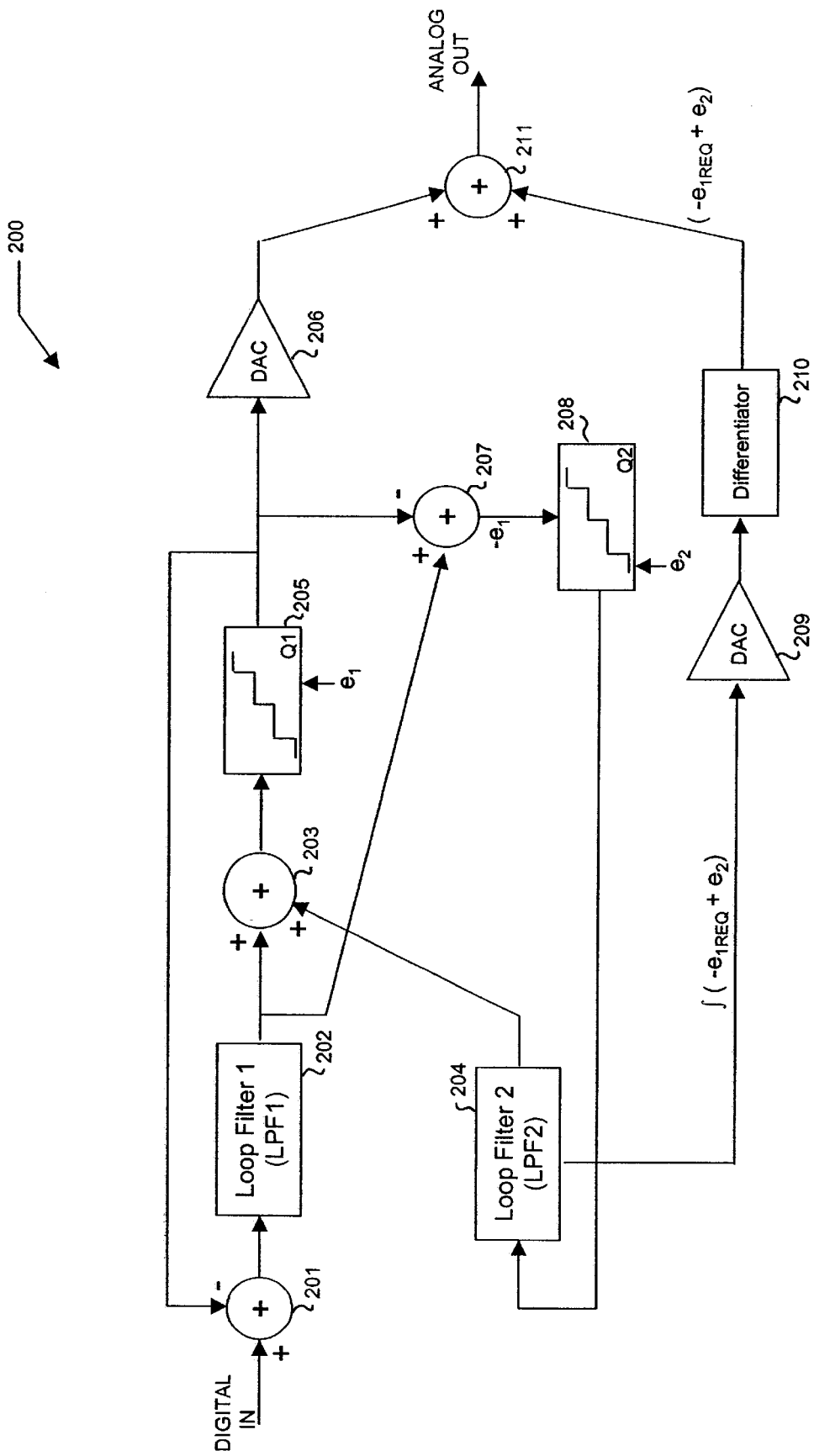
FIG. 2 is an operational diagram of an exemplary cascaded delta-sigma DAC embodying the inventive principles.
Figure 3:
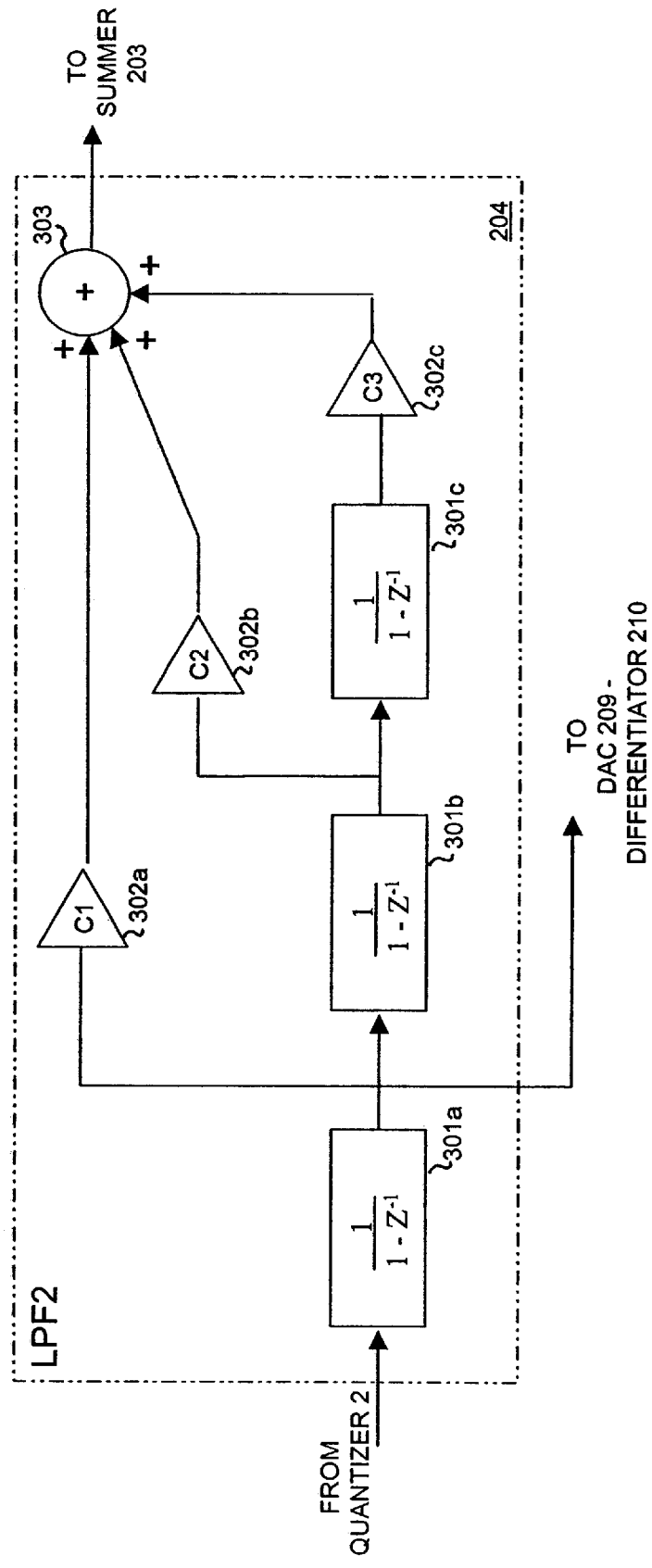
FIG. 3 is a more detailed operational diagram of an exemplary integrator-loop filter suitable for use in the second loop filter shown in FIG. 2.

The principles of the present invention and their advantages are best understood by referring to the illustrated embodiment depicted in FIGS. 1–3 of the drawings, in which like numbers designate like parts.

FIG. 1 is a diagram of a typical system application of digital to analog converter (DAC) subsystem 100 according to the principles of the present invention. In this example, DAC subsystem 100 forms part of an audio component 101, such as a compact disk (CD) player, digital audio tape (DAT) player, or digital video disk (DVD) unit. A digital media drive 102 recovers the digital data, for example 1-bit audio data in the Sony/Philips 1-bit format from the given digital data storage media, and passes those data, along with clock signals and control signals, to DAC subsystem 100. The resulting analog/audio data undergoes further processing in analog/audio processing block 103 prior to amplification in audio amplification amplifier block 104. Audio amplification block 104 then drives a set of conventional speakers 105a and b, such as stereo speakers, an audio headset, or the like.

Multi-bit digital audio data is serially received as words through the SDATA pin and serial interface/format selector, 101 timed by the sampling clock (SCLK). The left and right channel data are alternately processed in response to the left-right clock (LRCK). This LRCK clock is normally at the same rate as the data input rate (i.e., the sampling rate). The master clock (MCLK) signal provides the overall synchronization of the clock and control signals within DAC subsystem. The MCLK signal has a frequency rate of a selected oversampling multiple of the SCLK signal. Control signals DF1 and DF0 allow for the selection of the input format, such as right or left justified format, 20-bit or 24-bit word width format, etc. When 1-bit data is being input into DAC subsystem 100, the SDATA port (SDATA port is not shown in FIG. 1. receives left channel data and the DF1 port right channel data.

FIG. 2 is an operational block diagram of an exemplary delta-sigma digital to analog converter (DAC) 200 with multiple loop filters and split quantizers according to the principles of the present invention. DAC 200 may be utilized as DAC subsystem 100 in the typical system application shown in FIG. 1. DAC topology 200 includes an input summer 201 for summing the input signal DIGITAL_IN and a negative feedback signal into the input of a first loop filter 1 (LPF1) 202. In the illustrated embodiment, LPF1 202 is 6th order loop filter with a feedback structure, although the order and structure may change in alternate embodiments. A general discussion of the design and construction of various delta-sigma loop filter topologies is found in publications, such as Norsworthy et al., Delta-Sigma Data Converters, Theory, Design and Simulation, IEEE Press, 1996.

The output from LPF1 201 is summed by summer 203 with the output from a second digital loop filter (LPF2) 204. LPF2 204 is discussed in detail below, but generally integrates and noise shapes the re-quantized quantization error output of first quantizer 202.

The sum of the outputs from LPF1 201 and LPF2 204 generated by summer 203 is quantized in a first quantizer (Q1) 205. First quantizer 205 is a multiple-bit quantizer which truncates a multiple-bit output from summer 203 by a selected number of least significant bits (LSBs) thereby introducing a quantization error represented in FIG. 2 as additive noise e1. The quantized output from Q1 205 directly drives the input of a conventional integrating DAC stage 206 and is also fed-back to the inverting input of input summer 201 to close the primary delta-sigma loop.

The difference between the direct digital output from LPF1 202 and Q1 205 is taken by summer 207. The output of summer 207 is therefore the complement of the quantization error (i.e., −e1) resulting from the truncation of the digital data stream by Q1 205. The complement quantization error −e1 is itself then quantized by truncation in second quantizer (Q2) 208. Q2 208 also adds quantization error represented in FIG. 2 as additive noise e2. In the illustrated embodiment, Q2 208 has a quantization resolution at least eight (8) times greater than the quantization resolution of Q1 205 in order to minimize quantization error e2. For example, if Q1 205 outputs data words with an eight-bit quantization, then Q2 208 outputs data words with a quantization of at least sixty-four (64) bits.

The quantized quantization error −e1+e2 is integrated and noise shaped in LPF2 204. FIG. 3 depicts an exemplary embodiment of LPF2 204 that is a third-order feed-forward filter. In FIG. 3, LPF2 204 has three integrator stages 301a–301c and weighting stages 302a–302c weighting respective integrator outputs into summer 303 with corresponding weighting coefficients C1–C3. As discussed above with respects to LPF1 202, LPF2 204 in alternate embodiments may vary in order and structure, so long as the first stage 301a of second loop filter 204 is an integrator.

The once integrated and quantized quantization error −e1REQ+e2 tapped from first integrator stage 301a of LPF2 204 is fed-forward to DAC 209 and analog differentiator 210 shown in FIG. 2. The fully shaped output from LPF2 204 is fed-back to summer 203 to close the secondary delta-sigma loop including Q1 205 and Q2 208 and LPF2 204. The feedback signal from LPF2 204 to summer 203 ensures that the inputs to LPF2 204 remain bounded and that stages 301a–302b do not saturate.

Differentiator 210 recovers, in analog form, the quantized error −e1REQ+e2, and additionally adds a zero at DC (i.e., zero frequency) to the noise transfer function of −e1REQ+e2. This zero drives down the low frequency (in-band) components of −e1REQ+e2. The remaining (higher frequency) components of −e1REQ+e2 are summed by summer 211 with the output from direct path DAC 206. The output from differentiator 210 therefore drives down the high frequency out-of-band noise in the ultimate ANALOG OUT. Advantageously, analog differentiator 210 is relatively simple to construct and does not require high precision.

Exemplary code, in the C++ programming language, modeling exemplary noise shaping operations of cascaded modulator 200 is provided in the Appendix for reference. In this exemplary code, the call srfft (realdata, imaginarydata, loglen) is call to a general purpose fast fourier transform (FFT) routine in which realdata is a pointer to the real data to be transformed, imaginarydata is a pointer to the imaginary data to be transformed, and loglen is the logarithm to base two of the length. Suitable conventional FFT techniques are disclosed in such publications as Malvar, Signal Processing with Lapped Transforms, Artech House, Inc, Norwood, Mass., 1992.

In sum, the noise shaping of the quantization noise e1 from Q1 205 of modulator topology 200 is performed within the primary loop structure. Specifically, the complementary quantization error −e1 from Q1 205 is quantized by Q2 208, shaped by LPF2 204, and then fed-back to then input of Q1 205. This noise shaping of modulator topology 200 is in contrast with a conventional MASH topology in which the quantization noise from each noise shaping-loop is fed-forward to the input of the next noise shaping loop in the cascade as well as the corresponding cancellation logic. In other words, the noise shaping loops of a conventional MASH topology do not feedback to the prior noise shaping loops in the cascade.

Although the invention has been described with reference to a specific embodiments, these descriptions are not meant to be construed in a limiting sense. Various modifications of the disclosed embodiments, as well as alternative embodiments of the invention, will become apparent to persons skilled in the art upon reference to the description of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

It is therefore, contemplated that the claims will cover any such modifications or embodiments that fall within the true scope of the invention.

APPENDIX A

```
#include "stdafx.h"
#include <stdlib.h>
#include <math.h>
#include <stdio.h>
*******************************************************
*                                                     *
*                                                     *
*              Multi- level with differentiation      *
*                           DAC                       *
*                                                     *
*******************************************************
*/
void srfftl( double *xr, double *xi, int log); // standard fft, real imaginary,
log2 of length double
db(double x) {if(x>1.e-50)return 10*log10(x); else return −999.;}
double tpdf(double x) {return ( (rand( )&255)−(rand( )&255) )*x*sqrt
(6.)/255.+1.;}//st dev x
FILE *os;
int loglen,len,cycles,passes;
int sinlen, sinsh;
double *window,*data,*datai,*sine,*powbuf,*outsave;
double fs,level,dc;
double ele[16]={1.,1.,1.,1.,1.,1.,1.,1.,1.,1.,1.,1.,1.,1.,1.,1.}; // no error
double twele[16]={1.0,1.0,1.0,1.0,1.0,1.0,1.0,1.0,1.0,1.0,1.0,1.0,1.0,1.0,
1.0,1.0,}; // no error
int p;
/////////////////////////////////////////////////
/////////////////////////////////////////////////
//
//       Main delta sigma modulator - integral lp
//            100 kHz corner frequency
//
/////////////////////////////////////////////////
/////////////////////////////////////////////////
class sd6X16100{     // 6th order, 64 level stacked levels
long i0,i1,i2,i3,i4,i5,vi0,vi1;
int sh0,sh1,sh2,sh3,sh4,sh5;
long c0,c1,c2,c3,c4,c5;
long ditherm,dithoff;
double iscale;
double cap;
int shz32,shz54,sh45,sh34,sh23,sh12,sh01;
long sat0,sat1,sat2,sat3,sat4,sat5;
```

APPENDIX A-continued

```
int twint0,twint1,twint2;
int count;
double twlev[17];
inline long sat(long x,long y){ if(x>=y)return y−1;
    if(x+y<0)return −y;return x;}
public:
long i0m,i1m,i2m,i3m,i4m,i5m;
void sdreset(void);
void sd(double in, double *out);
};
void sd6X16100::sdreset(void) {
        int i;
        double flco[6]={
            7./(1L<<16),
            5./(1L<<11),
            7./(1L<< 8),
            3./(IL<< 4),
            9./(1L<< 4),
            3./(1L<<,2) };
        int shft [6]={30, 25, 18, 12, 9, 7};
        i0=i1=i2=i3=i4=i5=0;
        i0m=i1m=i2m=i3m=i4m=i5m=0; count=0;
        sh0=shft [0];
        sh1=shft [1];
        sh2=shft [2];
        sh3=shft [3];
        sh4=shft [4];
        sh5=shft [5];
        c0=long (pow (2., shft [0]) *flco [0] +.5);
        c1=long (pow (2., shft [1]) *flco [1] +.5);
        c2=long (pow (2., shft [2]) *flco [2] +.5);
        c3=long (pow (2., shft [3]) *flco [3] +.5);
        c4=long (pow (2., shft [4]) *flco [4] +.5);
        c5=long (pow (2., shft [5]) *flco [5] +.5);
        printf("hex coef=%08x %08x %08x %8x %08x %08x\n",
        c0, c1, c2, c3, c4, c5);
        shz32=10+sh3−sh2;// 1/1024
        shz54=8+sh5−sh4;// 1/256
        sh45=sh4−sh5; sh34=sh3−sh4; sh23=sh2−sh3; sh12=sh1−sh2;
        sh01=sh0−sh1;
        ditherm=15<<(sh5−4);dithoff=16<<(sh5−1); // 4 bits of dither,
        2 quant level
        iscale=32.0*c0−1; cap=0;
//Define word length of integrators
        sat0=1<<27;
        sat1=1<<26;
        sat2=1<<23;
        sat3=1<<19;
        sat4=1<<17;
        sat5=1<<15;
        twint0=8;
        twint1=twint2=0;
        twlev[0]=0;
        for(i=0; i<16; i++) twlev[i+1]=twlev[i]+twele[i];
        for(i=0; 1<=16; i++) twlev[i]*=1./twlev[16];
        for(i=0; i<=8; i++) twlev[16-i]=1.−(twlev[i]=(twlev[i]+
        1.−twlev[16-i])/2.);
        for(i=0; i<=16; i++) twlev[i]*=16;
}
void sd6X16100::sd(double in, double *out){
        const int limv=16;
        long ini=long (in*iscale+.5);
        for(int p=0; p<sinsh; p++) {
/***********************************************
Main delta sigma loop
6th order feedback type,
***********************************************/
            int q1 =// q gives 0 means −32, 64 means +32
            (((ditherm & rand())+i5+dithoff) >>sh5);
            if(q1>64) q1=64; if(q1<0) q1=0;
            int qbig= (q1+twint0) >>3;
// twint0, 1, 2 are the three integrators of the loop controlling
// the differentiated output i0−i5 are the 6 integrators controlling
the main loop filter
            if (twint1 *2+twint2<0) qbig−=(twint0==8
            && q1==32) ? 2:1;
            int twsave=twint0;
            twint0+=q1−(qbig<<3);
            twint1+=twint0−8; twint2+=twint1; // 8 is the center,
```

APPENDIX A-continued or target value for int 0
// if(count<100) fprintf(os, "delta %3d new %3d %5d %8d\n",
twint0-twsave, twint0, twint1, twint2);
   long qfb=q1–32;
   i4=sat (i4+(((i3>>sh34) -qfb*c4- (i5>>shz54)) ), sat4);
   i5=sat (i5+(((i4>>sh45) -qfb*c5) ), sat5);
   i2=sat (i2+(((i1>>sh12) -qfb*c2- (i3>>shz32)) ), sat2);
   i3=sat (i3+(((i2>>sh23) -qfb*c3) ), sat3);
   i1=sat (i1+(((i0>>sh01) -qfb*c1) ), sat1);
   i0=sat (i0+((ini-qfb*c0) ), sat0);
   if(abs (i0)>i0m) i0m=abs(i0);
   if(abs (i1)>i1m) i1m=abs(i1);
   if(abs (i2)>i2m) i2m=abs(i2);
   if(abs (i3)>i3m) i3m=abs(i3);
   if(abs (i4)>i4m) i4m=abs(i4);
   if(abs (i5)>i5m) i5m=abs(i5);
// for this sim, the non-differentiated part is perfect, and the differentiated part has mismatch
// In a real system, the direct part would use a DEM or equivalent technique
   double charge=(qbig-4) *8.+(twlev[twint0]-twlev[twsave]);
// do analog part
   * out++=cap=cap+(charge/32.-cap)*.25;
   // 4:1 ratio count++;
  }
};
sd6X16100 mod;
double w1 (double x){return log(x)/log(2)+1;}
void analyze(void) {
  int i;
  mod.sdreset( );
  double pscale = 1./((float)len*len)*2.663576/passes;
  for(i=0; i<len/2; i++) powbuf[i]=0;
  for(i=sinlen/2-10; i<sinlen/2; i++) mod.sd (dc+level*sine[i], data);
  double* datap=outsave; // prime the system
  for(i=sinlen/2; i<sinlen; i++, datap+=sinsh) mod.sd (dc+level*sine[i],datap);
  for(int pass=0; pass<passes; pass++){
   datap=datai;
   for(i=0; i<sinlen; i++, datap+=sinsh) mod.sd (dc+level*sine[i], datap);
   for(i=0; i<len/2; i++){
    data [i]=outsave [i];
    data [i+len/2]=datai [i];
    outsave [i]=datai [i+len/2];
   }
   for(int samp=0; samp<len; samp++) {
    data [samp]*=window[samp];
datai[samp]*=window [samp];
   }
  srfft1(data, datai, loglen);
  for(i=1; i<len/2; i++) powbuf [i]+=
   (data [i]*data[i] +data [len-i]*data [len-i] +datai [i] *datai [i] +datai
[len-i] *datai [len-i]) *pscale;
  }
  int bin20k=long (20000./fs*len+.5);
  int bin40k=long (40000./fs*len+.5);
  int bin80k=long (80000./fs*len+.5);
  double p20k=0;double p40k; double p80k; double ptot;
  for(i=3; i<bin20k; i++){
   if(((i<cycles-2) || (i>cycles+2)) && ((i+1) %cycles>2) )p20k+=powbuf[i];
  }
  double psig=powbuf [cycles-1] +powbuf[cycles] +powbuf [cycles+1];
  double psig2=powbuf [cycles*2-1] +powbuf [cycles*2] +powbuf [cycles*2+1];
  double psig3=powbuf [cycles*3-1] +powbuf [cycles*3] +powbuf [cycles*3+1];
  for (i=bin20k, p40k=p20k; i<bin40k; i++) p40k+=powbuf [i];
  for (i=bin40k, p80k=p40k; i<bin80k; i++) p80k+=powbuf [i];
  for (i=bin80k, ptot=p80k; i<len/2; i++) ptot+=powbuf [i];
  printf("\ndc=%5.2f 1st =%7.2f 2nd =%7.2f 3rd =%7.2f
n20k =%7.2f
n40k = %7.2f n80k =%7.2f ntot=%7.2f\n",
   dc, db (psig), db (psig2), db (psig3), db (p20k), db (p40k),
   db (p80k), db (ptot));
  fprintf(os,"\ndc=%5.2f 1st =%7.2f 2nd =%7.2f 3rd =%7.2f

APPENDIX A-continued n20k = %7.2f n40k = %7.2f n80k =%7.2f ntot=%7.2f\n",
   dc, db (psig), db (psig2), db (psig3), db (p20k), db (p40k),
   db (p80k) , db (ptot));
// Print out some statistics on integrator range
   printf ("max int bits %5.2f %5.2f %5.2f %5.2f %5.2f
   %5.2f\n",
w1 (mod.i0m), w1 (mod.i1m), w1 (mod.i2m), w1 (mod.i3m),
w1 (mod.i4m), w1 (mod.i5m));
  fprintf (os, "max int bits %5.2f %5.2f %5.2f %5.2f
  %5.2f %5.2f\n
",w1 (mod.i0m), w1 (mod.i1m), w1 (mod.i2m), w1 (mod.i3m),
w1 (mod.i4m), w1 (mod.i5m));
// Print stats on dem variables
}
void setele (double x) { //x is 3 sigma value for elements
  int i;
  for(i=0; i<16; i++){
   ele[i]=tpdf(x/3.);
  }
}
void seteletw (double x) { //x is 3 sigma value for elements
  int i;
  for(i=0; i<16; i++){
   twele[i]=tpdf (x/3.);
  }
}
void setmis (int set) {
  double pat[4] [16]={
   {0, 2, 1, 1, 1, 1, 1, 1, 1, 1, 1, 1, 1, 1, 1, 1, },
   {.5, .5, 1.5, 1.5, 1, 1, 1, 1, 1, 1, 1, 1, 1, 1, 1, 1, },
   {.75, .75, .75, .75, 1.25, 1.25, 1.25, 1.25, 1, 1, 1, 1, 1, 1, 1, 1},
   {.875, .875, .875, .875, .875, .875, .875, .875,
   1.125, 1.125, 1.125,
1.125, 1.125, 1.125, 1.125, 1.125}};
  for (int i=0; i<16; i++) ele [i]=
  pat[set][i];
}
void printele (void){
  int i;
  fprintf (os, "\nElement weights");
  for (i=0; i<15; i++) fprintf
(os,"%6.4f", ele [i]);
  fprintf (os,"\n\n");
  printf ("\n---Element weights");
  for (i=0; i<15; i++)
  printf("%6.4f", ele [i]);
  printf ("\n\n");
}
void printeletw (void){
  inti;
  fprintf (os,"\nTwiddle element weights");
  for(i=0; i<16; i++) fprintf(os,"%6.4f",
twele[i]);
  fprintf (os, "\n\n");
  printf("\n---Element weights");
  for (i=0; i<16; i++) printf("%6.4f",
twele[i]);
  printf ("\n\n");
}
void main (void){
  int i;
  os = fopen ("low_oob.txt", "w");
  loglen=17;
  passes=6;
  len=1 <<loglen;
  sinsh=4; sinlen=len/sinsh;
  window = new double [len];
  data = new double [len];
  datai = new double [len];
  sine = new double [sinlen];
  powbuf = new double [len/2];
  outsave = new double [len/2];
  fs=128*44100;
  printf ("fs=%f len = %ld sinsh=%d passes %d time %f seconds\n",
fs, len, sinsh, passes, len/fs*passes);
  fprintf(os, "fs=%f len = %ld sinsh= %d passes %d time
%fseconds\n",fs, len, sinsh, passes, len/fs*passes);
// make sine wave
   double tone=1000;

APPENDIX A-continued

```
        cycles=int (.5+tone/fs*len);
        printf("cycles = %d actual frequency= %f\n",
        cycles, cycles*fs/len);
        fprintf(os, "cycles = %d actual frequency= %f\n",
        cycles, cycles* fs/len);
        long double w=2*3.1415926535897932385*cycles/len*sinsh;
        for (i=0; i<sinlen; i++) sine [i]=sin (w*i);
// make window
        for(i=0; i<len; i++) window [i]=.5*(1.-cos(2*3.1415926/len*
        (i-.5))); fprintf (os, "\n";
///////////////////////////////////////////////////
//          Test loop - vary signal level, etc
///////////////////////////////////////////////////
        for (int sets=0; sets<10;sets++) {
// set up elements
//          if(sets>0) setele (.1);
            if(sets>0) seteletw (.05);
//          setmis (sets);
// print mismatch
            printeletw ();
            for (int sigdb=-600; sigdb<=-30; sigdb+=570) {
//          for (int sigdb=-600; sigdb<=-30; sigdb+=30) {
//          for (int sigdb=-25; sigdb<=-1; sigdb+=1) {
//          for (int sigdb=-60; sigdb<=-5; sigdb+=5) {
                level=pow (10, sigdb/200.);
                for (dc=0.; dc<=.9; dc+=1.01){analyze( );
            }
      }
    }
        printf ("\n"); fprint (os,"\n");
        getchar( );
        printf("\ndone\n");
        fclose (os);
}
```

What is claimed is:

1. A delta-sigma data converter comprising:
a first quantizer responsive to outputs of first and second loop filters, the first quantizer introducing a quantization error and the first loop filter responsive to an output of the first quantizer;
a second quantizer for quantizing an error data stream representing the quantization error introduced by the first quantizer to produce a quantized data error stream, wherein the second loop filter includes an integrator for integrating the quantized error data stream; and
an analog output path responsive to the output of the first quantizer and an output of the integrator.

2. The delta-sigma data converter of claim 1, wherein the analog output path comprises:
a first digital to analog conversion path for converting a quantized digital data stream output from the first quantizer into a first analog stream;
a second digital to analog conversion path for converting into a second analog stream and differentiating an integrated quantized error data stream output from the integrator; and
a summer for summing the first analog stream from the first digital to analog conversion path and a differentiated second analog stream from the second digital to analog conversion path to generate an analog output signal with reduced out-of-band noise.

3. The delta-sigma data converter of claim 1, further comprising circuitry for generating the error data stream from a quantized digital data stream output from the first quantizer.

4. The delta-sigma data converter of claim 3, wherein the circuitry for generating the error data stream comprises a summer for subtracting a digital data stream input to the first quantizer from the quantized digital data stream output from the first quantizer to extract data bits truncated by the first quantizer during quantization.

5. The delta-sigma data converter of claim 1, wherein the first quantizer quantizes a received digital data stream with a first quantization resolution and the second quantizer quantizes the error data stream with a second quantization resolution greater than the first quantization resolution.

6. The delta-sigma data converter of claim 1, wherein the second loop filter comprises:
a first filter stage comprising the integrator; and
a second filter stage in series with the integrator.

7. The delta-sigma data converter of claim 1, further comprising:
an input summer for summing a digital input data stream and a quantized digital data stream fed-back from the output of the first quantizer; and
a second summer for summing a first filtered data stream output from the first loop filter and a filtered, quantized error stream from the second loop filter to generate a data stream input to the first quantizer.

8. The delta-sigma data converter of claim 1, wherein an input digital data stream input to the first quantizer comprises digital audio data.

9. A method of converting a digital data stream to an analog signal with reduced out-of-band noise comprising:
quantizing with a quantization error a combination of first and second filtered data streams to generate a quantized data stream;
filtering the quantized data stream to generate the first filtered data stream;
quantizing a error data stream representing the quantization error;
integrating the quantized error data stream to generate an integrated quantized error data stream;
filtering the quantized error data stream to generate the second filtered data stream; and
generating the analog signal from the first filtered data stream and the integrated quantized error data stream.

10. The method of claim 9, wherein generating the analog signal comprises:
converting the quantized data stream into a first analog stream;
converting the integrated quantized error data stream into a second analog stream;
differentiating the second analog data stream; and
summing the first analog stream and the differentiated second analog stream to generate the analog signal with reduced out-of-band noise.

11. The method of claim 9, wherein quantizing the error data stream comprises deriving the error data stream from a difference between the first filtered data stream and the quantized data stream.

12. The method of claim 9, wherein quantizing a combination of the first and second filtered data streams comprises quantizing with a first number of quantization levels and quantizing the error data stream comprises quantizing with a second number of quantization levels, the second number of quantization levels greater than the first number of quantization levels.

13. The method of claim 9, wherein integrating the quantized error data stream comprises integrating the quantized error data stream in a first integrator stage of a loop filter generating the second filtered data stream.

14. The method of claim 9, further comprising generating the combination of the filtered first and second data streams by summing a first filtered data stream output from a first loop filter responsive to an output of a first quantizer generating the quantized data stream and a second data stream output from a second loop filter responsive to an output of a second quantizer generating the quantized error data stream.

15. A delta-sigma modulator comprising:
   an input summer for summing an input signal with feedback;
   a first loop filter for filtering an output from the input summer;
   a first quantizer generating a quantized output signal from a first quantizer input signal and the feedback to the input summer;
   a second quantizer for quantizing a quantization error introduced by the first quantizer;
   a second loop filter for filtering the quantized quantization error; and
   a second summer for summing the filtered quantization error with an output of the input summer to generate the first quantizer input signal.

16. The delta-sigma modulator of claim 15, further comprising an analog output path responsive to the output of the first quantizer and a selected output of the second loop filter.

17. The delta-sigma modulator of claim 15, wherein the selected output of the second loop filter comprises an output of an integrator stage comprising a selected stage of the second loop filter.

18. The delta-sigma modulator of claim 15, wherein the analog output path comprises:
   a first digital to analog conversion path for converting the quantized output signal generated by the first quantizer into a first analog stream;
   a second digital to analog conversion path for converting into a second analog stream and differentiating an integrated quantized error data stream tapped from the second loop filter; and
   a summer for summing the first analog stream and a differentiated second analog streams to generate an analog output signal with reduced out-of-band noise.

19. An audio system comprising:
   a source of digital audio data; and
   a digital to analog converter comprising:
      a first quantizer responsive to outputs of first and second loop filters, the first quantizer introducing a quantization error during quantization and the first loop filter responsive to an output of the first quantizer;
      a second quantizer for quantizing an error data stream representing the quantization error introduced by the first quantizer, the second loop filter including an integrator for integrating a quantized error data stream output from the second quantizer; and
      an analog output path responsive to the output of the first quantizer and an output of the integrator.

20. The audio system of claim 19, wherein:
   a first digital to analog conversion path for converting a quantized digital data stream output from the first quantizer into a first analog stream;
   a second digital to analog conversion path for converting into a second analog stream and differentiating an integrated quantized error data stream output from the integrator; and
   a summer for summing the first analog stream and a differentiated second analog streams to generate an analog output signal with reduced out-of-band noise.

21. A digital to analog converter comprising:
   a cascaded noise shaper for receiving a digital to analog data stream and in response outputting first and second noise-shaped data streams;
   first and second digital to analog converter stages for respectively converting the first and second noise shaped data streams into first and second analog streams; and
   an output stage for combining the first and second analog streams wherein out-of-band noise in the first analog stream cancels out-of-band noise in the second analog stream.

* * * * *